US009704923B1

(12) United States Patent
Bernhardt et al.

(10) Patent No.: US 9,704,923 B1
(45) Date of Patent: Jul. 11, 2017

(54) DUAL-LAYER DIELECTRIC IN MEMORY DEVICE

(71) Applicant: Intel Corporation, Santa Clara, CA (US)

(72) Inventors: Michael J. Bernhardt, Boise, ID (US); Yudong Kim, Boise, ID (US); Denzil S. Frost, Boise, ID (US); Tuman Earl Allen, III, Kuna, ID (US); Kevin Lee Baker, Boise, ID (US); Kolya Yastrebenetsky, Boise, ID (US); Ronald Allen Weimer, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/998,194

(22) Filed: Dec. 23, 2015

(51) Int. Cl.
| | |
|---|---|
| *H01L 27/24* | (2006.01) |
| *H01L 23/528* | (2006.01) |
| *H01L 23/532* | (2006.01) |
| *H01L 21/768* | (2006.01) |
| *H01L 21/311* | (2006.01) |
| *H01L 23/00* | (2006.01) |
| *H01L 23/522* | (2006.01) |
| *H01L 27/105* | (2006.01) |

(52) U.S. Cl.
CPC .... *H01L 27/2481* (2013.01); *H01L 21/31133* (2013.01); *H01L 21/76837* (2013.01); *H01L 21/76877* (2013.01); *H01L 23/528* (2013.01); *H01L 23/5226* (2013.01); *H01L 23/53295* (2013.01); *H01L 24/16* (2013.01); *H01L 27/105* (2013.01); *H01L 23/53257* (2013.01); *H01L 2224/16113* (2013.01); *H01L 2224/16157* (2013.01); *H01L 2924/1443* (2013.01); *H01L 2924/15311* (2013.01)

(58) Field of Classification Search
CPC ................... H01L 27/2481; H01L 27/76837
See application file for complete search history.

(56) References Cited

U.S. PATENT DOCUMENTS

| | | | |
|---|---|---|---|
| 2010/0090286 A1 | 4/2010 | Lee et al. | |
| 2013/0189799 A1 | 7/2013 | Zhang et al. | |
| 2013/0277639 A1* | 10/2013 | BrightSky | H01L 27/2454 257/5 |

(Continued)

OTHER PUBLICATIONS

International Search Report and Written Opinion, mailed Mar. 6, 2017, issued in corresponding International Application No. PCT/US2016/062954, 16 pages.

*Primary Examiner* — Dung Le
(74) *Attorney, Agent, or Firm* — Schwabe, Williamson & Wyatt, P.C.

(57) ABSTRACT

Embodiments of the present disclosure describe techniques and configurations for a memory device comprising a memory array having a plurality of wordlines disposed in a memory region of a die. Fill regions may be disposed between respective pairs of adjacent wordlines of the plurality of wordlines. The fill regions may include a first dielectric layer and a second dielectric layer disposed on the first dielectric layer. The first dielectric layer may comprise organic (e.g., carbon-based) spin-on dielectric material (CSOD). The second dielectric layer may comprise a different dielectric material than the first dielectric layer, such as, for example, inorganic dielectric material. Other embodiments may be described and/or claimed.

8 Claims, 6 Drawing Sheets

(56) References Cited

U.S. PATENT DOCUMENTS

| | | |
|---|---|---|
| 2014/0151774 A1 | 6/2014 | Rhie |
| 2014/0154866 A1* | 6/2014 | Hwang ............... H01L 21/7682 438/424 |
| 2015/0179660 A1 | 6/2015 | Yada et al. |
| 2015/0179706 A1 | 6/2015 | Rocklein et al. |
| 2016/0020295 A1* | 1/2016 | Chen .................... H01L 29/456 257/49 |

* cited by examiner

DUAL-LAYER DIELECTRIC IN MEMORY DEVICE

FIELD

Embodiments of the present disclosure generally relate to the field of integrated circuits (IC), and more particularly, to fabrication techniques for a non-volatile memory device.

BACKGROUND

A typical flash memory device may comprise a memory array that includes a large number of non-volatile memory cells arranged in row and column fashion. In recent years, vertical memory, such as three-dimensional (3D) memory has been developed in various forms, such as NAND, cross-point, or the like. A 3D flash memory array may include a plurality of memory cells stacked over one another. Each group of memory cells may share a plurality of access lines, known as wordlines (WLs) and bitlines (BLs).

In a memory device fabrication, a memory array including access lines (e.g., wordlines) may be etched in a memory region of a die, and connectivity with circuitry may be provided through an adjacent periphery region of a die. The memory array fabrication may include a number of operations, including filling gaps between the wordlines (or bitlines) etched in a die with a dielectric fill material, in order to provide desired structural integrity.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for a memory device comprising a memory array having a plurality of wordlines disposed in a memory region of a die. Fill regions may be disposed between respective pairs of adjacent wordlines of the plurality of wordlines. The fill regions may include a first dielectric layer and a second dielectric layer disposed on the first dielectric layer. The first dielectric layer may comprise organic (e.g., carbon-based) spin-on dielectric material (CSOD). The second dielectric layer may comprise a different dielectric material than the first dielectric layer, such as, for example, inorganic dielectric material.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
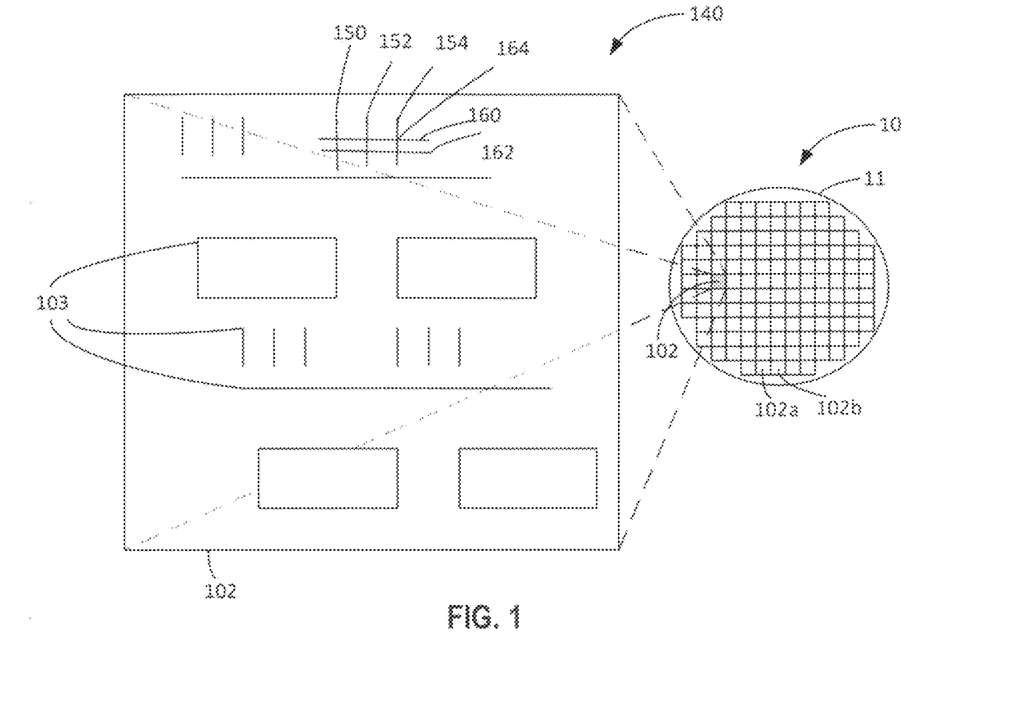
FIG. 1 illustrates an example die in which a memory device may be provided using the techniques of the present disclosure, in accordance with some embodiments.

FIG. 1 illustrates an example die in which a memory device may be provided using the techniques of the present disclosure, in accordance with some embodiments. More specifically, FIG. 1 schematically illustrates a top view of die 102 in wafer form 10 and in singulated form 140, in accordance with some embodiments. In some embodiments, the die 102 may be one of a plurality of dies (e.g., die 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that may include a memory device as described herein. For example, the die 102 may include circuitry 103 of a memory device in accordance with some embodiments. According to various embodiments, the circuitry 103 may include one or more memory elements (cells), which may be configured in an array, such as a two-dimensional (2D) or three-dimensional (3D) non-volatile memory array. In some embodiments, the memory array may comprise a cross-point memory array, or other byte addressable nonvolatile memory devices. Examples of memory elements include multi-threshold level NAND flash memory, NOR flash memory, single or multi-level Phase Change Memory (PCM), Resistive RAM (ReRAM/RRAM), phase-change RAM exploiting certain unique behaviors of chalcogenide glass, nanowire memory, ferroelectric transistor random access memory (FeTRAM), Ferroelectric RAM (FeRAM/FRAM), Magnetoresistive Random-Access Memory (MRAM), Phase-change memory (PCM/PCMe/PRAM/PCRAM, aka Chalcogenide RAM/CRAM) conductive-bridging RAM (cbRAM, aka programmable metallization cell (PMC) memory), SONOS ("Silicon-Oxide-Nitride-Oxide-Silicon") memory, FJRAM (Floating Junction Gate Random Access Memory), Conductive metal-oxide (CMOx) memory, battery backed-up DRAM spin transfer torque (STT)-MRAM, magnetic computer storage devices (e.g. hard disk drives, floppy disks, and magnetic tape), or a combination of any of the above, or other memory, and so forth. In one embodiment, the nonvolatile memory can be a block addressable memory device, such as NAND or NOR technologies. Embodiments are not limited to these examples. The circuitry 103 may further include memory element access devices, or switches, such as, for example, an ovonic threshold switch (OTS), threshold vacuum switch, silicon or oxide based P-N diode, or other switching devices configured for use in selection/programming operations of the memory elements.

The circuitry 103 may further include one or more wordlines (e.g., 150, 152, 154) and one or more bitlines (e.g., 160, 162) coupled to the memory elements. Only three wordlines and two bitlines are shown in FIG. 1 for ease of understanding. In some embodiments, the bitlines and wordlines may be configured such that each of the memory elements may be disposed at an intersection (e.g., 164) of each individual bitline and wordline (e.g., 160 and 154), in a cross-point configuration. A voltage or bias can be applied to a target memory element of the memory elements using the wordlines and the bitlines to select the target memory cell for a read or write operation. Bitline drivers may be coupled to the bitlines and wordline drivers may be coupled to the wordlines to facilitate decoding/selection of the memory elements. To enable memory cell selection, the wordlines 150, 152, 154 may be connected with memory cells and other parts of circuitry 103 via interconnects, including respective contact structures (e.g., vias) that provide electrical connectivity through the layers of the die 102 as described below in greater detail. It is noted that the circuitry 103 is only schematically depicted in FIG. 1 and may represent a wide variety of suitable logic or memory in the form of circuitry or other suitable devices and configurations including, for example, one or more state machines including circuitry and/or instructions in storage (e.g., firmware or software) configured to perform actions such as read, program, verify and/or analysis operations.

In embodiments, fill regions may be disposed between respective pairs of adjacent wordlines of the plurality of wordlines (e.g., 150, 152, 154), e.g., to provide structural integrity for the memory array. The fill regions may include a first dielectric layer and a second dielectric layer disposed on the first dielectric layer. The first dielectric layer may comprise organic (e.g., carbon-based) spin-on dielectric material (CSOD). The second dielectric layer may comprise a different dielectric material than the first dielectric layer, such as, for example, inorganic dielectric material. These and other aspects will be further described below.

In some embodiments, the circuitry 103 may be formed using suitable semiconductor fabrication techniques, some of which are described herein. After a fabrication process of the semiconductor product is complete, the wafer 11 may undergo a singulation process in which each of the dies (e.g., die 102) may be separated from one another to provide discrete "chips" of the semiconductor product. The wafer 11 may be any of a variety of sizes. According to various embodiments, the circuitry 103 may be disposed on a semiconductor substrate in wafer form 10 or singulated form 140. In some embodiments, the die 102 may include logic or memory, or combinations thereof.

Figure 2:
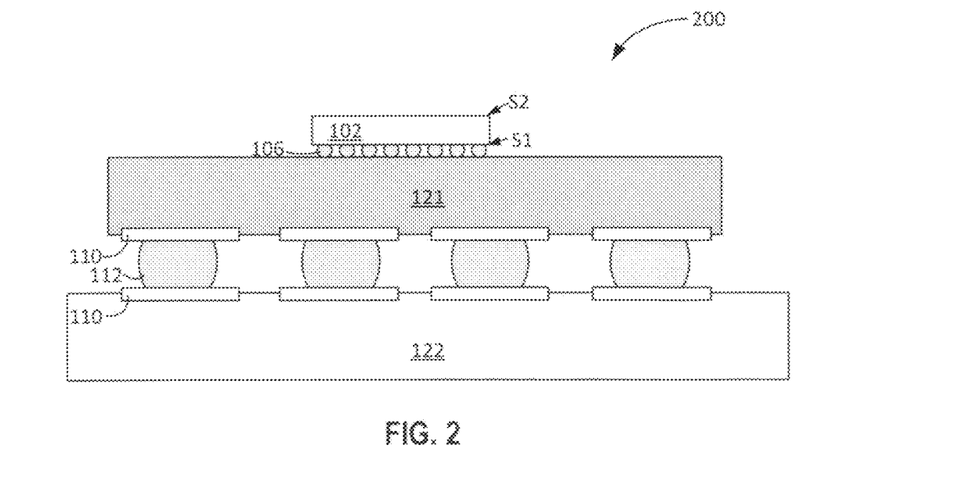
FIG. 2 schematically illustrates a cross-section side view of an integrated circuit (IC) assembly that may include a memory device provided using the techniques of the present disclosure, in accordance with some embodiments.

FIG. 2 schematically illustrates a cross-section side view of an integrated circuit (IC) assembly 200 that may include a memory device provided in accordance with some embodiments described herein. In some embodiments, the IC assembly 200 may include one or more dies (e.g., die 102 of FIG. 1) electrically and/or physically coupled with a package substrate 121. In some embodiments, the die 102 may be, include, or be a part of an IC including a memory, processor, System on chip (SoC) or application-specific integrated circuit (ASIC). For example, the die 102 may include circuitry (e.g., circuitry 103 of FIG. 1) such as a memory device as described herein. The die 102 may represent a discrete product made from a semiconductor material (e.g., silicon) using semiconductor fabrication techniques such as thin film deposition, lithography, etching and the like used in connection with forming memory devices. In some embodiments, an electrically insulative material such as, for example, molding compound or underfill material (not shown) may encapsulate at least a portion of the die 102 and/or die-level interconnect structures 106.

The IC assembly 200 may include a wide variety of configurations including, for example, suitable combinations of flip-chip and/or wire-bonding configurations, interposers, multi-chip package configurations including System in Package (SiP) and/or Package on Package (PoP) configurations. For example, the die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, memory elements as described in reference to FIG. 1. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate 121 using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures, fabrication of some of which is described below.

In some embodiments, the package substrate 121 may comprise an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

In some embodiments, the package substrate 121 may be coupled with a circuit board 122, as can be seen. The circuit board 122 may be a printed circuit board (PCB) composed of an electrically insulative material such as an epoxy laminate. For example, the circuit board 122 may include electrically insulating layers composed of materials that may be laminated together. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 may be a motherboard and may be included in a computing device, such as, for example, a mobile device.

Package-level interconnects such as, for example, solder balls 112 may be coupled to pads 110 on the package substrate 121 and/or on the circuit board 122 to form corresponding solder joints that may be configured to further route the electrical signals between the package substrate 121 and the circuit board 122. The pads 110 may be composed of any suitable electrically conductive material such as metal. The package-level interconnect may include other structures and/or configurations including, for example, land-grid array (LGA) structures and the like.

In embodiments, the die 102 of the IC assembly 200 may be, include, or be a part of an IC including a memory device as described herein. The process of fabrication of a memory device comprising circuitry 103 in a die, such the die 102, according to the techniques of the present disclosure is described in reference to FIGS. 3A-3F.

FIGS. 3A-3D schematically illustrate example cross-section side views of a memory device in a first plane, showing different stages of forming a memory array in a die, in accordance with some embodiments. FIGS. 3E and 3F schematically illustrate example cross-section side views of the memory device in a second plane that is orthogonal to the first plane. It will be understood that various features of a memory device, e.g., electrical routing features, interconnect structures, and the like, that may be formed in the memory device manufacturing process, are not shown in FIGS. 3A-3F for ease of understanding. Also for ease of understanding, the like elements of the memory device depicted in FIG. 3A-3F are enumerated with like numerals. The fabrication process of a memory device is described in application to the wordline formation in the memory array. It is noted that a similar process may be applied to fabrication of other structures of the memory array, such as additional levels (decks) of the memory device, and is omitted herein for brevity.

Figure 3A:
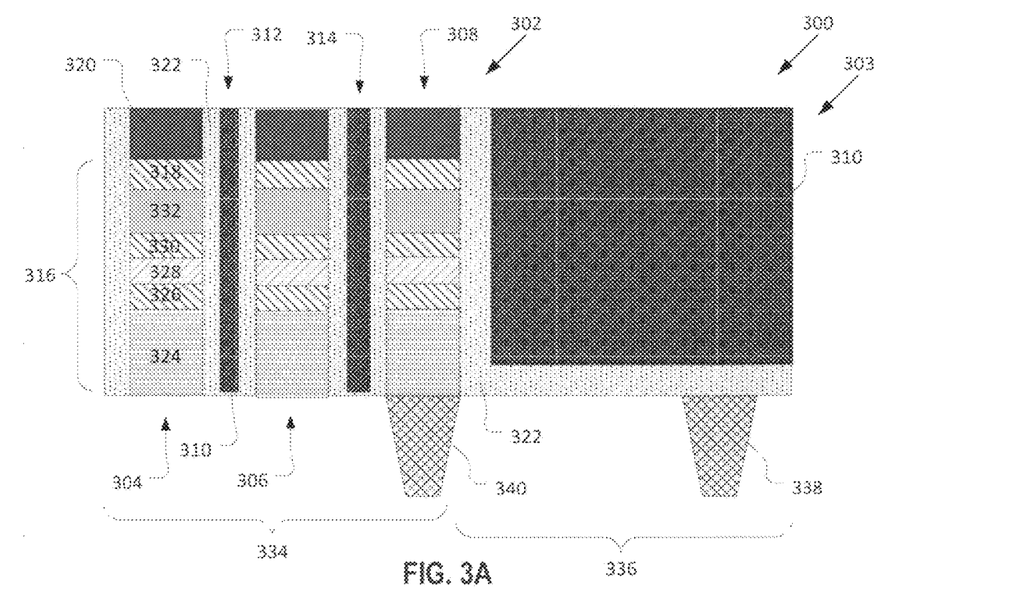
FIGS. 3A-3D schematically illustrate example cross-section side views of a memory device in a first plane, showing different stages of forming a memory array in a die, in accordance with some embodiments.

Referring to FIG. 3A, a memory device 300 is depicted subsequent to forming a memory array 302 including a plurality of wordlines 304, 306, and 308 in a die 303. As shown, the memory device 300 is further depicted subsequent to a deposition of a fill material 310 between respective pairs of adjacent wordlines of the wordlines 304, 306, and 308 (e.g., in a fill region 312 between the wordlines 304 and 306, and in a fill region 314 between wordlines 306 and 308). The fill regions 312 and 314 may provide structural integrity for the memory array 302. Only three wordlines of the plurality of wordlines are depicted in FIG. 3A (and subsequent FIGS. 3B-3D) for ease of understanding, although it will be understood that the memory array 302 may include any suitable number of wordlines.

In various embodiments, individual wordlines of the plurality of wordlines, such as wordline 304, may include a cell stack 316, a hard mask layer (e.g., silicon nitride) 320, and/or a sealing layer (also referred to as a liner) 322. The sealing layer 322 may be coupled to and extend along the sides of the cell stack 316 and/or the hard mask layer 320. In various embodiments, the cell stack 316 may include one or more layers, such as a wordline metal (e.g., tungsten) 324, a bottom electrode layer 326, a selector device layer 328, a middle electrode layer 330, a storage device layer 332, and/or a top electrode layer 318 as shown. The top electrode layer 318, bottom electrode layer 326, and/or middle electrode layer 330 may include a conductive material, such as a carbon-containing conductor, tungsten, etc. The storage device layer 332 may include one or more memory cells, and the selector device layer 328 may include one or more access devices, such as one or more transistors.

The cell stack 316 may include different layers and/or a different arrangement of layers in other embodiments. For example, in some embodiments, the selector device layer 328 may be disposed above the storage device layer 332 in the cell stack 316.

As shown, the memory array 302 may be disposed in a memory region 334 of the memory device 300. The memory device 300 may further include a periphery region 336 located adjacent to the memory region 334, as shown. The periphery region 336 may be used for provision of interconnects between the memory array 302 and circuitry of the IC comprising the memory device 300, such as circuitry 103 described in reference to FIG. 1. One of such interconnects, a via 338 comprising a conductor (e.g., tungsten), is shown in FIG. 3A for illustration purposes. The memory device 300 may further include one or more vias, such as via 340, disposed in the memory region 334 (e.g., below a wordline).

As discussed above, the fill material 310 may be disposed between adjacent pairs of wordlines of the plurality of wordlines (e.g., in fill regions 312 and 314). In various embodiments, a layer of the fill material 310 may be deposited on the memory region 334 and the periphery region 336 of the memory device 300. In conventional devices, the fill layer 310 may include an inorganic spin-on dielectric, an oxide dielectric film, or an alkoxide compound material, such as tetraethyl orthosilicate (TEOS), or the like. However, the use of the above-mentioned materials may cause unwanted voids in the fill regions 312 and/or 314 between the wordlines. In order to avoid the voids and provide desired structural integrity for the memory array 302, an organic spin-on dielectric material, such as a carbon-rich oxide film (hereinafter CSOD) may be used as a fill material 310 in the fill regions 312 and/or 314.

However, the fill material 310 of CSOD may be susceptible to reliability issues, such as high dry etch rate, high dry strip rate, and/or rip-outs during subsequent processing of the memory device 300 (e.g., formation of bitlines). Accordingly, a portion of the CSOD fill material 340 in the fill regions 312 and 314 may be removed and replaced with another dielectric material (e.g., an inorganic dielectric material, an oxide dielectric film, and/or an alkoxide compound such as TEOS) as described further below. Therefore, the fill regions 312 and 314 between respective adjacent pairs of the wordlines 304, 306, and 308 may have a first layer of fill material 310 (e.g., CSOD), and a second layer of a different fill material (e.g., an inorganic dielectric material, an oxide dielectric film, and/or an alkoxide compound such as TEOS). The second layer may prevent subsequent etching of the fill materials (e.g., during formation of the bitlines) from exposing the selector device layer 326 or the wordline metal layer 324. Additionally, or alternatively, the second layer may provide structural support for the bitlines.

Figure 3B:
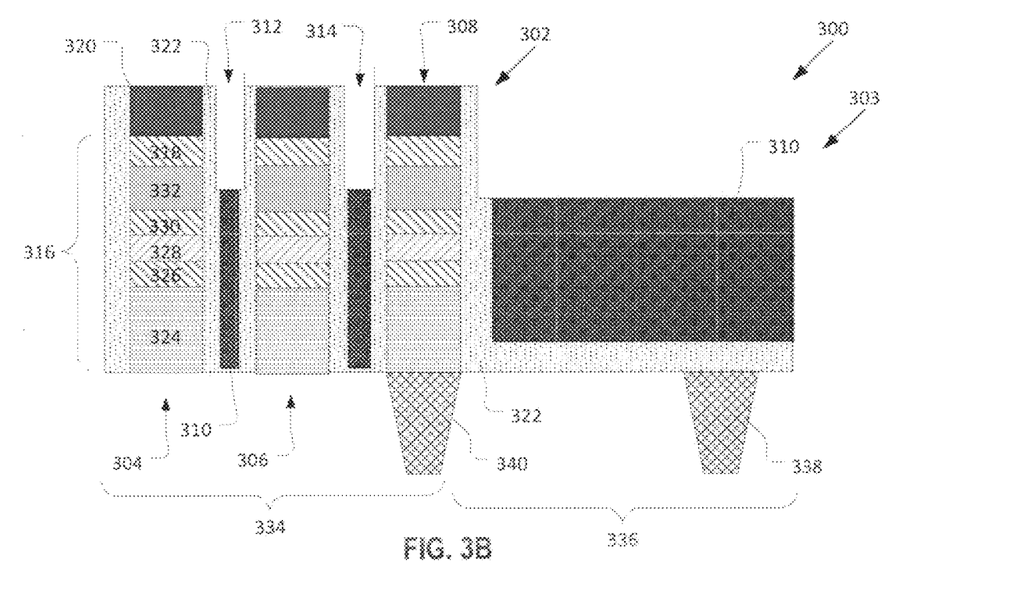

In FIG. 3B, the memory device 300 is depicted subsequent to removing a portion of the fill material 310 in the fill regions 312 and 314. The portion of the fill material 310 may be removed by any suitable process, such as an etch process. In some embodiments, a portion of the sealing layer 322 may also be removed along with the portion of the fill material 310, as shown in FIG. 3B. Additionally, or alternatively, in some embodiments a portion of the fill material 310 in the periphery region 336 may also be removed.

In some embodiments, the fill material 310 may be removed down to a level that is aligned with or below the bottom surface of the top electrode layer 318. In some embodiments, the fill material 310 may not be removed past the upper surface of the middle electrode layer 330. This level may provide a desired balance between the benefits of the CSOD material of the first fill layer and the benefits of the second fill layer, as previously discussed.

Figure 3C:
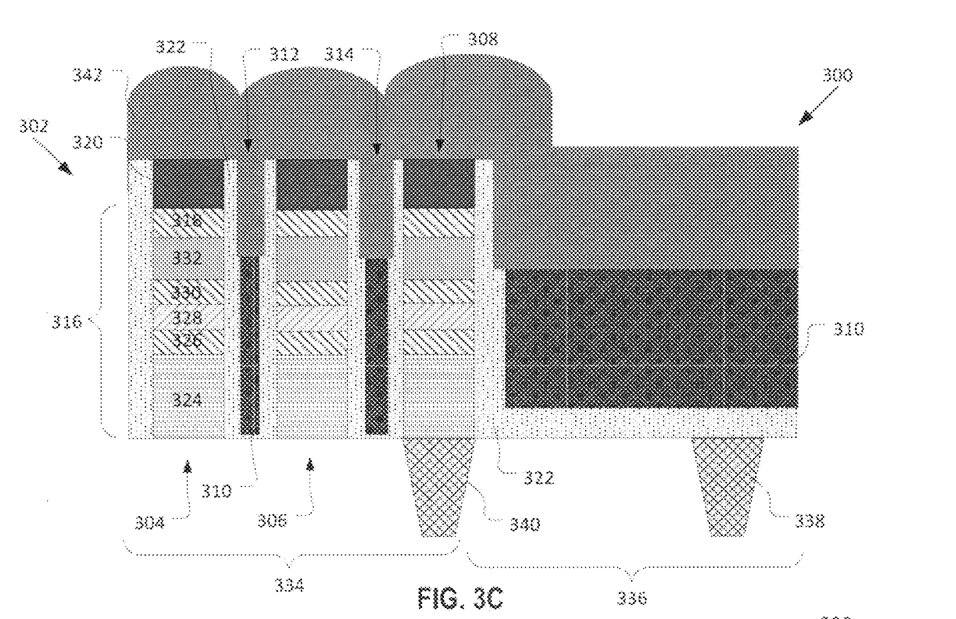

In FIG. 3C, the memory device 300 is depicted subsequent to deposition of a fill material 342 on the fill material 310. The fill material 342 may be deposited in the fill regions 312 and 314 (e.g., in the openings provided by etching away the portions of the fill material 310). In some embodiments, the fill material 342 may further be deposited in the periphery region 336. As discussed above, the fill material 342 may be a different material than fill material 310. For example, fill material 342 may be an inorganic dielectric material, an oxide dielectric film, and/or an alkoxide compound such as TEOS. Accordingly, the fill regions 312 and 314 may include a first dielectric layer of the fill material 310 and a second dielectric layer of the fill material 342 disposed on the first dielectric layer.

In some embodiments, as discussed above, a portion of the sealing layer 322 may be removed along with the portion of the fill material 310. Accordingly, a portion of the layer of fill material 342 may be disposed on the sealing layer 322, as shown.

Figure 3D:
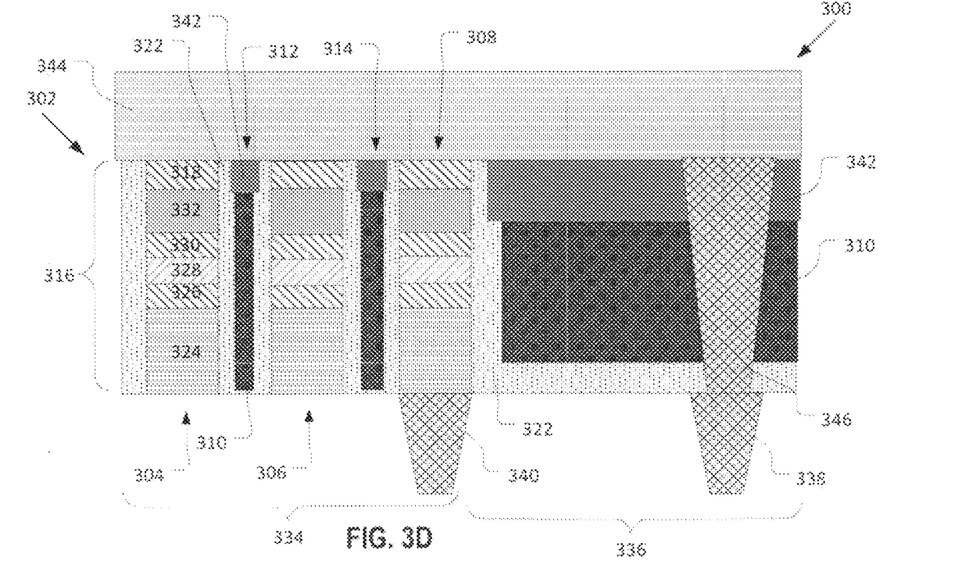
Figure 3E:
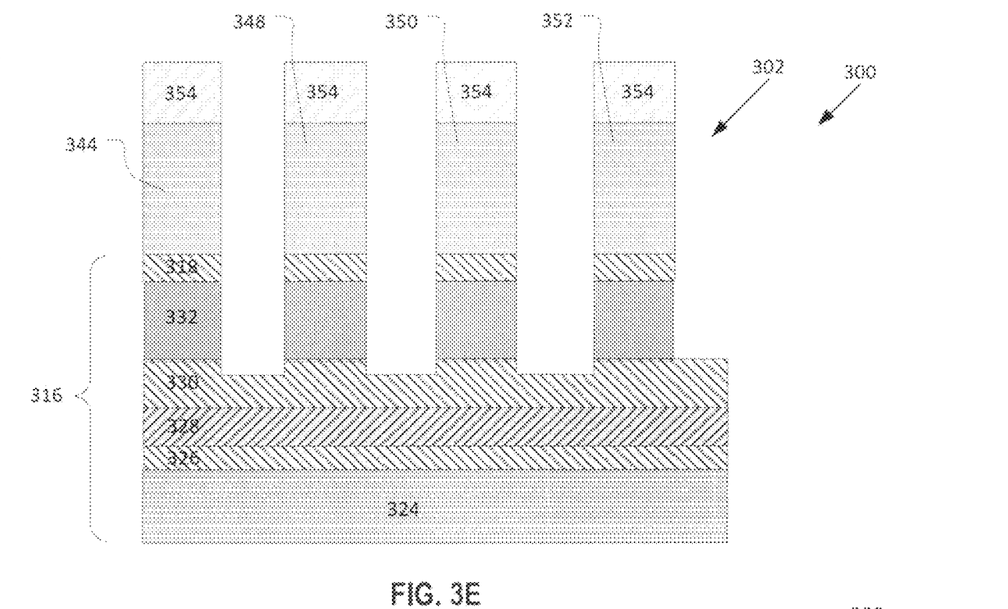
FIGS. 3E and 3F schematically illustrate example cross-section side views of the memory device of FIGS. 3E and 3F in a second plane that is orthogonal to the first plane, showing different stages of forming a memory array in a die, in accordance with some embodiments.
Figure 3F:
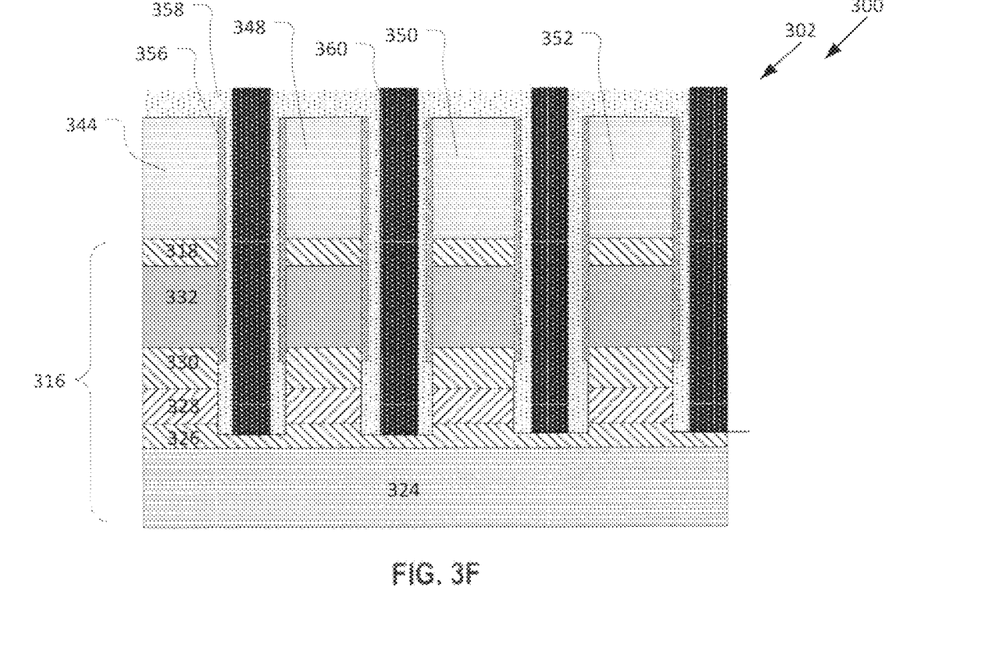

In FIG. 3D, the memory device 300 is depicted subsequent to polishing of a top surface of the memory device 300 and formation of a bitline 344. The polishing may remove the hard mask layer 320 and/or excess fill material 342. Any suitable polishing process, such as chemical mechanical planarization (CMP), may be used. Different planarization techniques may be used in addition or in the alternative to CMP, such as CMP and dry etch back, for example. The bitline 344 may be formed of a conductor, such as tungsten. The bitline 344 may be formed across the wordlines 304, 306, and 308, and may be disposed on the top electrode layer 318, the sealing layer 322, and/or the fill material 342. Although only one bitline 344 is shown in FIG. 3D, it will be apparent that other bitlines may be formed across the wordlines 304, 306, and 308 in parallel with the bitline 344 (for example, bitlines 348, 350, and 352 shown in FIGS. 3E and 3F).

In some embodiments, a via 346 may be formed in the periphery region 336 (e.g., through the fill material 310 and the fill material 342) to conductively couple the bitline 344 to the via 338.

In various embodiments, after the bitlines are formed across the wordlines 304, 306, and 308, an etch and refill process may be performed to generate the bitline structure. For example, a first partial etch may be performed to etch the cell stack 316 between the bitlines down to the middle electrode layer 330.

FIGS. 3E and 3F illustrate the memory device 300 in a cross-sectional plane that is orthogonal to the cross-sectional plane shown in FIGS. 3A-3D. FIG. 3E illustrates a cross-sectional view of the memory device 300 subsequent to a first partial etch between the bitlines. Bitlines 344, 348, 350, and 352 are shown in FIG. 3E on wordline 306. A hard mask layer (e.g., silicon nitride) 354 is disposed on the bitlines 344, 348, 350, and 352. As shown, the cell stack 316 is etched down to the middle electrode layer 330 (e.g., the top electrode layer 318 and storage device layer 318 are removed). Although not shown in FIG. 3E, the fill regions 312 and 314 between the wordlines 304, 306, and 308 may also be etched during the first partial etch. The presence of the fill material 342 on the fill material 310 may prevent the selector device layer 328 from being exposed by the first partial etch. For example, the top surface of the fill material 310 in the fill regions 312 and 314 may be substantially co-planar with or above the top surface of the cell stack 316 between the bitlines 344, 348, 350, and 352 after the first partial etch. Accordingly, the fill regions 312 and 314 may also be etched down to the level of the middle electrode layer 330.

FIG. 3F illustrates a cross-sectional view of the memory device 300 subsequent to a second etch, seal, and refill process. As shown, the hard mask layer 354 may be removed and a liner 356 may be formed on the sides of the bitlines 344, 348, 350, and 352, as well as on the sides of the cell stack 316 that were exposed by the first partial etch.

A second partial etch may be performed to remove a further portion of the cell stack 316 down to the bottom electrode layer 326 (e.g., the middle electrode layer 330 and the selector device layer 328 may be removed) between the bitlines 344, 348, 350, and 352. A sealing liner 358 may be formed on the liner 356 and the exposed sides of the cell stack 316. In some embodiments, the sealing liner 358 may be the same material as one or more of the sealing layer 322, and/or electrode layers 318, 326, and/or 330. Alternatively, the sealing liner 358 may be a different material from the sealing layer 322 and/or electrode layers 318, 326, and/or 330. A dielectric material (e.g., CSOD) 360 may be formed in the fill regions between the bitlines 344, 348, 350, and 352 and in the etched portions of the cell stack 316. Although not shown in FIG. 3F, the fill regions 312 and 314 between the wordlines 304, 306, and 308 may also be etched during the second partial etch and refilled with the dielectric material 360.

Figure 4:
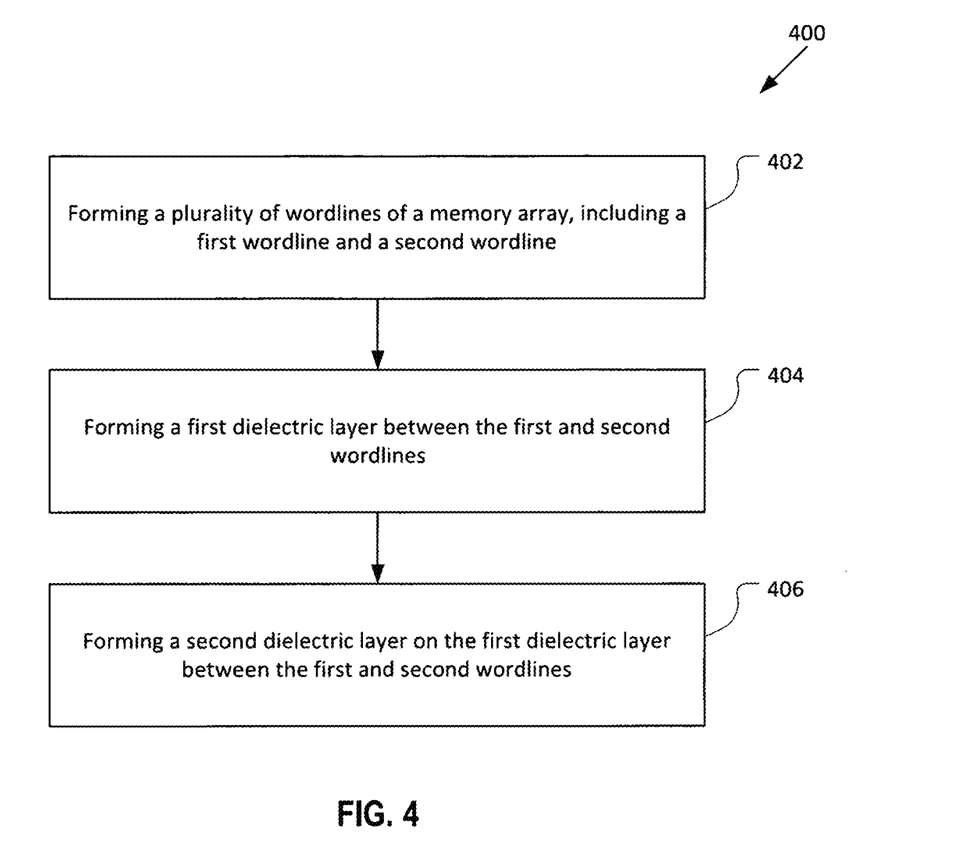
FIG. 4 is a process flow diagram for providing a memory array disposed in a die with a dual-layer dielectric disposed between wordlines of the memory array using techniques of the present disclosure, in accordance with some embodiments.

FIG. 4 is a process flow diagram that illustrates a process 400 for providing a memory array disposed in a die with a first dielectric layer and a second dielectric layer disposed between wordlines of the memory array using techniques of the present disclosure, in accordance with some embodiments. The process 400 may comport with actions described in connection with FIGS. 3A-3F in some embodiments. As noted above, the process 400 may apply to formation of wordlines or bitlines in a memory array in accordance with embodiments described herein. The application of the process 400 to formation of wordlines is provided for purposes of illustration and for ease of understanding.

At block 402, the process 400 may include forming a plurality of wordlines of the memory array including a first wordline and a second wordline. Forming a plurality of wordlines may include various processes, such as dry etch, cleaning, and/or deposition of a liner. As a result, the wordlines may include a cell stack, a hard mask layer (e.g., silicon nitride), and/or a sealing layer.

At block 404, the process 400 may further include forming a first dielectric layer between the first and second wordlines. Forming the first dielectric layer may include depositing a first dielectric material, such as organic spin-on dielectric material (CSOD) in a fill region between the first and second wordlines. The first dielectric material may be deposited in a plurality of fill regions between respective pairs of adjacent wordlines of the plurality of wordlines.

Depositing the first dielectric material may further include providing a sealing layer on the sides and/or bottom of the fill region between the first and second wordlines, and depositing the first dielectric layer on top of the sealing layer.

At block 406, the process 400 may further include forming a second dielectric layer on the first dielectric layer between the first and second wordlines. Forming the second dielectric layer may include depositing a second dielectric material on the first dielectric material in the fill region between the first and second wordlines. The second dielectric material may be different than the first dielectric layer. For example, the second dielectric material may include an inorganic dielectric material, an oxide dielectric film, and/or an alkoxide compound such as TEOS.

Forming the second dielectric layer may further include removing the first dielectric material from a portion of the fill region between the first and second wordlines, and depositing the second dielectric material in the portion of the fill region. In some embodiments, the process 400 may further include forming one or more structures on the second dielectric layer, such as one or more bitlines.

Various operations of the process 400 are described as multiple discrete operations, in a manner that is most helpful in understanding the claimed subject matter. However, the order of description should not be construed as to imply that these operations are necessarily order dependent. It will be appreciated that the sequence of operations associated with the process 400 may vary and/or include other actions in accordance with the present disclosure. For example, some operations may be performed at the same time.

The memory arrays and methods described herein may be implemented into a system using any suitable hardware and/or software to configure as desired.

Figure 5:
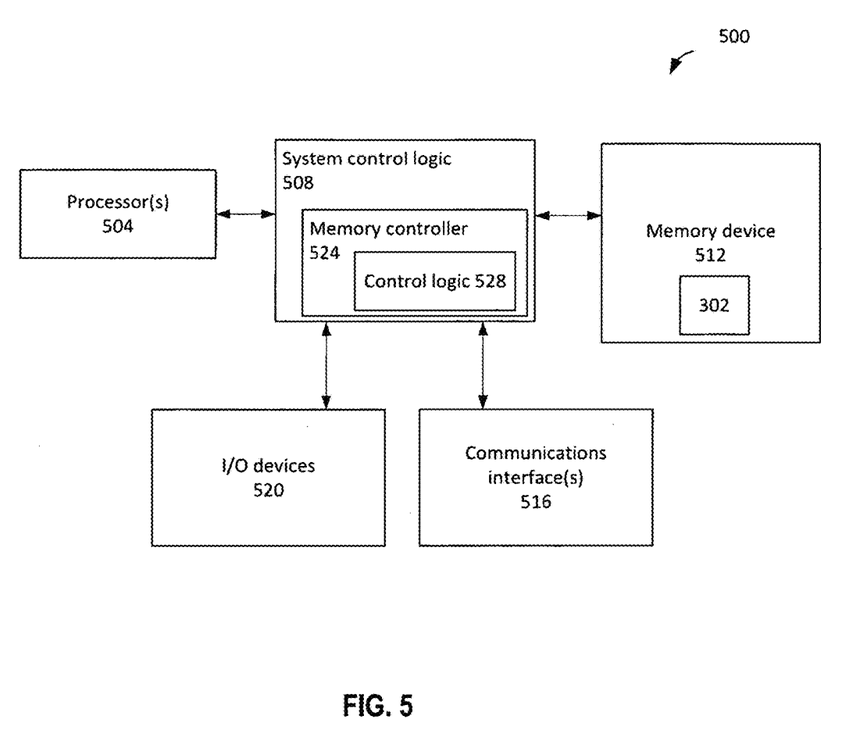
FIG. 5 schematically illustrates an example computing device including a memory array disposed in a die with a dual-layer dielectric disposed between wordlines of the memory array using techniques of the present disclosure, in accordance with some embodiments.

FIG. 5 schematically illustrates an example computing device including a memory array disposed in a die with a dual-layer dielectric (e.g., including a first dielectric layer and a second dielectric layer on the first dielectric layer) disposed between adjacent wordlines of the memory array using techniques of the present disclosure, in accordance with some embodiments. The computing device 500 may include system control logic 508 coupled to one or more processor(s) 504; a memory device 512 having a memory array 302 described in reference to FIGS. 3A-3F; one or more communications interface(s) 516; and input/output (I/O) devices 520.

The memory device 512 may be a non-volatile computer storage chip (e.g., provided on the die 102 of FIGS. 1-2) that may include the memory device 300 of FIGS. 3A-3F. In embodiments, the memory device 512 may comprise a package, such as IC assembly 200 of FIG. 2, having the memory device 300 disposed therein, driver circuitry (e.g., drivers), input/output connections to electrically couple the memory device 512 with other components of the computing device 500, etc. The memory device 512 may be configured to be removably or permanently coupled with the computing device 500. The memory device 512 may include a memory array 302 described in reference to FIGS. 3A-3F. The memory array 302 may include a first dielectric layer and a second dielectric layer disposed between adjacent wordlines of the memory array 302 using the techniques described with reference to FIG. 4.

Communications interface(s) 516 may provide an interface for computing device 500 to communicate over one or more network(s) and/or with any other suitable device. Communications interface(s) 516 may include any suitable hardware and/or firmware. Communications interface(s) 516 for one embodiment may include, for example, a network adapter, a wireless network adapter, a telephone modem, and/or a wireless modem. For wireless communications, communications interface(s) 516 for one embodiment may use one or more antennas to communicatively couple the computing device 500 with a wireless network.

For one embodiment, at least one of the processor(s) 504 may be packaged together with logic for one or more controller(s) of system control logic 508. For one embodiment, at least one of the processor(s) 504 may be packaged together with logic for one or more controllers of system control logic 508 to form a System in Package (SiP). For one embodiment, at least one of the processor(s) 504 may be integrated on the same die with logic for one or more controller(s) of system control logic 508. For one embodiment, at least one of the processor(s) 504 may be integrated on the same die with logic for one or more controller(s) of system control logic 508 to form a System on Chip (SoC).

System control logic 508 for one embodiment may include any suitable interface controllers to provide for any suitable interface to at least one of the processor(s) 504 and/or to any suitable device or component in communication with system control logic 508. The system control logic 508 may move data into and/or out of the various components of the computing device 500.

System control logic 508 for one embodiment may include a memory controller 524 to provide an interface to the memory device 512 to control various memory access operations. The memory controller 524 may include control logic 528 that may be specifically configured to control access of the memory device 512.

In various embodiments, the I/O devices 520 may include user interfaces designed to enable user interaction with the computing device 500, peripheral component interfaces designed to enable peripheral component interaction with the computing device 500, and/or sensors designed to determine environmental conditions and/or location information related to the computing device 500. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 516 to communicate with components of a positioning network, e.g., a global positioning system (GPS) satellite.

In various embodiments, the computing device 500 may be a wearable computing device; a mobile computing device such as, but not limited to, a laptop computing device, a tablet computing device, a netbook, a smartphone, etc.; a desktop computing device; a workstation; a server; etc. The computing device 500 may have more or fewer components, and/or different architectures. In further implementations, the computing device 500 may be any other electronic device that processes data.

Some non-limiting Examples of various embodiments are provided below.

Example 1 is an apparatus comprising: a memory array comprising a plurality of wordlines; and fill regions between respective pairs of adjacent wordlines of the plurality of wordlines, wherein one or more of the fill regions includes a first dielectric material and a second dielectric material disposed on the first dielectric material, wherein the first dielectric material comprises an organic spin-on dielectric material (CSOD), and wherein the second dielectric material comprises a second dielectric material that is different from the first dielectric material.

Example 2 is the apparatus of example 1, wherein the second dielectric material comprises one or more of an inorganic dielectric material or alkoxide compound material.

Example 3 is the apparatus of example 2, wherein the alkoxide compound material includes tetraethyl orthosilicate (TEOS).

Example 4 is the apparatus of example 1, further comprising a plurality of bitlines disposed on the second dielectric material.

Example 5 is the apparatus of example 1, wherein individual wordlines of the plurality of wordlines comprise a cell stack comprising a top electrode layer, wherein a lower surface of the second dielectric material is about at or below a level of a lower surface of the top electrode layer.

Example 6 is the apparatus of example 5, wherein the cell stack comprises a selector device layer and a storage device layer.

Example 7 is the apparatus of example 1, further comprising a sealing layer coupled to a side surface of the wordlines, wherein a portion of the second dielectric material is disposed on the sealing layer.

Example 8 is the apparatus of example 1, wherein the memory array further comprises a peripheral portion adjacent to the plurality of wordlines, wherein the peripheral portion includes: the first dielectric material; the second dielectric material disposed on the first dielectric material; and one or more vias disposed through the first and second dielectric materials to provide electrical connectivity for the memory array with circuitry associated with the memory array.

Example 9 is the apparatus of example 1, wherein the memory array comprises a three-dimensional (3D) memory array.

Example 10 is a method comprising: forming a plurality of wordlines of a memory array comprising a first wordline and a second wordline; forming a first dielectric layer between the first wordline and the second wordline; and forming a second dielectric layer on the first dielectric layer between the first wordline and the second wordline, wherein the second dielectric layer is formed of a different material than the first dielectric layer.

Example 11 is the method of example 10, wherein the first dielectric layer comprises an organic spin-on dielectric material (CSOD), and wherein the second dielectric layer comprises an inorganic dielectric material or alkoxide compound material.

Example 12 is the method of example 10, further comprising etching away a portion of the first dielectric layer between the wordlines prior to forming the second dielectric layer on the first dielectric layer.

Example 13 is the method of example 12, further comprising forming a sealing layer coupled to a side of the wordlines, wherein the etching comprises etching away a portion of the sealing layer.

Example 14 is the method of example 12, wherein forming the plurality of wordlines comprises forming a cell stack of individual wordlines of the plurality of wordlines, wherein the cell stack comprises a top electrode layer, and wherein the etching includes etching away the first dielectric layer to a level at or below a lower surface of the top electrode layer.

Example 15 is a system comprising: a processor; and a memory coupled to the processor. The memory of Example 15 comprises: a plurality of wordlines, individual wordlines of the plurality of wordlines comprising a cell stack having a top electrode layer; a first dielectric layer disposed between respective pairs of the individual wordlines; and a second dielectric layer disposed on the first dielectric layer between the respective pairs of the individual wordlines, wherein the second dielectric layer is formed of a different material than the first dielectric layer, and wherein a lower surface of the second dielectric layer is about at or below a level of a lower surface of the top electrode layer.

Example 16 is the system of example 15, wherein the first dielectric layer comprises an organic spin-on dielectric material (CSOD), and wherein the second dielectric layer comprises an inorganic dielectric material or alkoxide compound material.

Example 17 is the system of example 15, wherein the cell stack further comprises a selector device layer and a storage device layer.

Example 18 is the system of example 15, further comprising a sealing layer coupled to a side surface of the wordlines, wherein a portion of the second dielectric layer is disposed on the sealing layer.

Example 19 is the system of example 15, wherein the memory array further comprises a peripheral portion adjacent to the plurality of wordlines, wherein the peripheral portion comprises: the first dielectric layer; the second dielectric layer disposed on the first dielectric material; and one or more vias disposed through the first and second dielectric layers to provide electrical connectivity for the memory array with circuitry associated with the memory array.

Example 20 is the system of example 15, wherein the memory comprises a cross-point memory.

Example 21 is the system of example 15, wherein the system comprises a mobile computing device, the mobile computing device further comprising at least one of: a display coupled to the processor; a network interface coupled to the processor; or a battery coupled to the processor.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. An apparatus comprising:
a memory array comprising a plurality of wordlines and a plurality of bitlines; and
fill regions between respective pairs of adjacent wordlines of the plurality of wordlines, wherein one or more of the fill regions includes a first dielectric material and a second dielectric material disposed on the first dielectric material, wherein the plurality of bitlines is disposed on the second dielectric material, wherein the first dielectric material comprises an organic spin-on dielectric material (CSOD), and wherein the second dielectric material comprises a second dielectric material that is different from the first dielectric material.

2. The apparatus of claim 1, wherein the second dielectric material comprises one or more of an inorganic dielectric material or alkoxide compound material.

3. The apparatus of claim 2, wherein the alkoxide compound material includes tetraethyl orthosilicate (TEOS).

4. The apparatus of claim 1, wherein individual wordlines of the plurality of wordlines comprise a cell stack comprising a top electrode layer, wherein a lower surface of the second dielectric material is about at or below a level of a lower surface of the top electrode layer.

5. The apparatus of claim 4, wherein the cell stack comprises a selector device layer and a storage device layer.

6. An apparatus comprising:
a memory array comprising a plurality of wordlines;
fill regions between respective pairs of adjacent wordlines of the plurality of wordlines, wherein one or more of the fill regions includes a first dielectric material and a second dielectric material disposed on the first dielectric material, wherein the first dielectric material comprises an organic spin-on dielectric material (CSOD), and wherein the second dielectric material comprises a second dielectric material that is different from the first dielectric material; and a sealing layer coupled to a side surface of the wordlines, wherein a portion of the second dielectric material is disposed on the sealing layer.

7. An apparatus comprising:
a memory array comprising a plurality of wordlines;
fill regions between respective pairs of adjacent wordlines of the plurality of wordlines, wherein one or more of the fill regions includes a first dielectric material and a second dielectric material disposed on the first dielectric material, wherein the first dielectric material comprises an organic spin-on dielectric material (CSOD), and wherein the second dielectric material comprises a second dielectric material that is different from the first dielectric material, wherein the memory array further comprises a peripheral portion adjacent to the plurality of wordlines, wherein the peripheral portion includes:
the first dielectric material;
the second dielectric material disposed on the first dielectric material; and
one or more vias disposed through the first and second dielectric materials to provide electrical connectivity for the memory array with circuitry associated with the memory array.

8. The apparatus of claim 1, wherein the memory array comprises a three-dimensional (3D) memory array.

* * * * *